(12) United States Patent
Lim et al.

(10) Patent No.: US 11,864,440 B2
(45) Date of Patent: Jan. 2, 2024

(54) ELECTROLUMINESCENT DISPLAY DEVICE

(71) Applicant: LG Display Co., Ltd., Seoul (KR)

(72) Inventors: Hee-Tae Lim, Paju-si (KR); Ji-Ho Kang, Paju-si (KR); Hak-Min Lee, Paju-si (KR); Hyuk-Chan Gee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 281 days.

(21) Appl. No.: 17/519,143

(22) Filed: Nov. 4, 2021

(65) Prior Publication Data
US 2022/0173206 A1 Jun. 2, 2022

(30) Foreign Application Priority Data

Nov. 30, 2020 (KR) .................. 10-2020-0164864

(51) Int. Cl.
| | |
|---|---|
| *H10K 59/131* | (2023.01) |
| *H10K 50/824* | (2023.01) |
| *H10K 59/121* | (2023.01) |
| *H10K 59/122* | (2023.01) |
| *H10K 50/818* | (2023.01) |
| *H10K 50/828* | (2023.01) |
| *H10K 59/35* | (2023.01) |
| *H10K 102/00* | (2023.01) |

(52) U.S. Cl.
CPC ....... *H10K 59/1315* (2023.02); *H10K 50/824* (2023.02); *H10K 59/121* (2023.02); *H10K 59/122* (2023.02); *H10K 50/818* (2023.02); *H10K 50/828* (2023.02); *H10K 59/352* (2023.02); *H10K 2102/3026* (2023.02)

(58) Field of Classification Search
CPC ............. H10K 59/1315; H10K 59/122; H10K 50/824; H10K 59/121; H10K 2102/3026; H10K 50/818; H10K 50/828
USPC ......................................................... 257/72
See application file for complete search history.

(56) References Cited

U.S. PATENT DOCUMENTS

| | | | |
|---|---|---|---|
| 2013/0146878 A1* | 6/2013 | Oh ........................ | H10K 50/852 977/773 |
| 2016/0247870 A1* | 8/2016 | Park .................... | H10K 59/1216 |
| 2017/0141176 A1* | 5/2017 | Im ........................... | H10K 50/82 |
| 2019/0207168 A1* | 7/2019 | Lee ........................ | H10K 50/844 |

* cited by examiner

*Primary Examiner* — Xia L Cross
(74) *Attorney, Agent, or Firm* — Birch, Stewart, Kolasch & Birch, LLP

(57) ABSTRACT

An electroluminescent display device includes a substrate having an emission area and a transparent portion, the emission area including a sub-pixel, and the transparent portion being adjacent to the sub-pixel; a first electrode in the emission area and over the substrate; a transparent connection pattern in the transparent portion and over the substrate, the transparent connection pattern being spaced apart from the first electrode; a first bank covering an edge of the first electrode and exposing the transparent connection pattern in the transparent portion; and a second bank on the first bank and covering the transparent connection pattern in the transparent portion, wherein the second bank includes a transparent conductive material.

20 Claims, 6 Drawing Sheets

ELECTROLUMINESCENT DISPLAY DEVICE

CROSS-REFERENCE TO RELATED APPLICATION

The present application claims priority from and the benefit under 35 U.S.C § 119(a) of Korean Patent Application No. 10-2020-0164864 filed on Nov. 30, 2020 in the Republic of Korea, the entire contents of which are hereby expressly incorporated by reference in its entirety into the present application.

BACKGROUND OF THE INVENTION

Field of the Disclosure

The present disclosure relates to an electroluminescent display device, and more particularly, to a transparent electroluminescent display device having a large size and high resolution.

Discussion of the Related Art

As one of the flat panel display devices, an electroluminescent (EL) display device has wide viewing angles as compared with a liquid crystal display device since it is self-luminous. It also has the advantages of light weight, a thin thickness and low power consumption since a backlight unit is not needed.

In addition, the EL display device is driven by low voltages of direct current (DC) and has a fast response time. Further, the EL display device is strong against the external impacts and is used in a wide range of temperatures because its components are solids, and particularly, the electroluminescent display device can be manufactured at low costs.

Moreover, since the EL display device can include a transparent area, the EL display device can have a transparent property (or characteristic) and can be applied to various fields.

However, since the EL display device is manufactured by a deposition process, the production cost can be increased due to the preparation of a mask used in the deposition process. In addition, there is a limitation in application to a large-sized and high-resolution display device due to manufacturing variations, sagging, shadow effect of the mask, and the like.

Moreover, since the organic material is deposited in the deposition process to manufacture the EL display device, there can be a limitation of providing the transparent area.

SUMMARY OF THE INVENTION

Accordingly, the present disclosure is directed to a transparent display device that substantially obviates one or more of the problems due to limitations and disadvantages of the related art.

An object of the present disclosure is to provide a transparent display device having a large size and high resolution.

Additional features and advantages of the present disclosure will be set forth in the description which follows, and in part will be apparent from the description, or can be learned by practice of the present disclosure. The objectives and other advantages of the present disclosure will be realized and attained by the structure particularly pointed out in the written description and claims hereof as well as the appended drawings.

To achieve these and other advantages and in accordance with the purpose of the present disclosure, as embodied and broadly described herein, there is provided an electroluminescent display device that includes a substrate having an emission area and a transparent portion, the emission area including a sub-pixel, and the transparent portion being adjacent to the sub-pixel; a first electrode in the emission area and over the substrate; a transparent connection pattern in the transparent portion and over the substrate, the transparent connection pattern being spaced apart from the first electrode; a first bank covering an edge of the first electrode and exposing the transparent connection pattern in the transparent portion; and a second bank on the first bank and covering the transparent connection pattern in the transparent portion, wherein the second bank includes a transparent conductive material.

It is to be understood that both the foregoing general description and the following detailed description are by example and explanatory and are intended to provide further explanation of the present disclosure as claimed.

BRIEF DESCRIPTION OF THE DRAWINGS

The accompanying drawings, which are included to provide a further understanding of the present disclosure and which are incorporated in and constitute a part of this specification, illustrate an embodiment of the present disclosure and together with the description serve to explain the principles of the present disclosure. In the drawings.

DETAILED DESCRIPTION OF THE EMBODIMENTS

Reference will now be made in detail to exemplary embodiments of the disclosure, examples of which are illustrated in the accompanying drawings.

An EL display device according to one or more embodiments of the present disclosure includes a plurality of pixels to display an image, and each of the plurality of pixels includes red, green and blue sub-pixels. However, each pixel can have any of other combinations of color sub-pixels, e.g., red, green, blue and white sub-pixels. First, second and third sub-pixels corresponding to the red, green and blue sub-pixels can have a configuration shown in FIG. 1. Further, all components of each EL display device according to all embodiments of the present disclosure are operatively coupled and configured.

Figure 1:
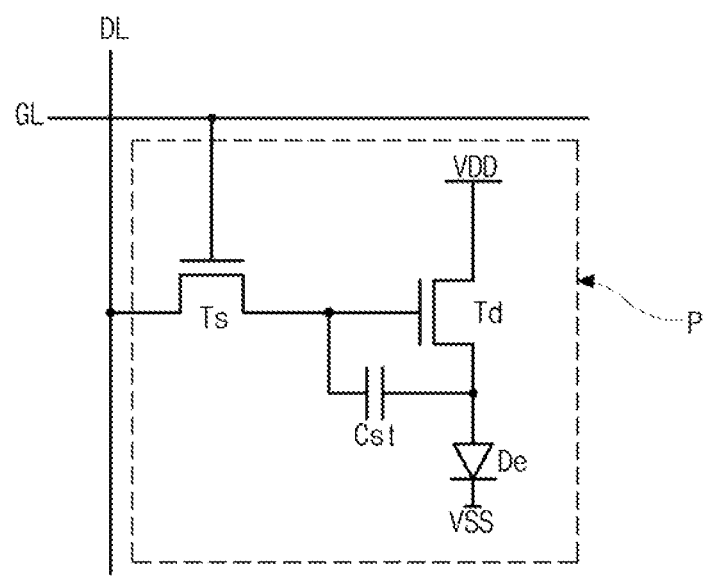
FIG. 1 is a circuit diagram of one pixel of an EL display device according to an embodiment of the present disclosure.

FIG. 1 is a circuit diagram of one pixel of an EL display device according to an embodiment of the present disclosure. According to all embodiments of the present disclosure, each of all the pixels in the EL display devices or one or more of the pixels in the EL display devices can have the configuration of the pixel shown in FIG. 1.

In FIG. 1, the EL display device according to the present disclosure includes a plurality of gate lines GL and a plurality of data lines DL crossing each other to define sub-pixels P, and a switching thin film transistor (TFT) Ts, a driving TFT Td, a storage capacitor Cst and a light emitting diode De are provided in each sub-pixel P.

More specifically, a gate electrode of the switching TFT Ts is connected to the gate line GL, and a source electrode of the switching TFT Ts is connected to the data line DL. A gate electrode of the driving TFT Td is connected to a drain electrode of the switching TFT Ts, and a source electrode of the driving TFT Td is connected to a high voltage supply VDD. An anode of the light emitting diode De is connected to a drain electrode of the driving TFT Td, and a cathode of the light emitting diode De is connected to a low voltage supply VSS. The storage capacitor Cst is connected to the gate electrode and the drain electrode of the driving TFT Td.

The EL display device is driven to display an image. For example, when the switching TFT Ts is turned on by a gate signal applied through the gate line GL, a data signal from the data line DL is applied to the gate electrode of the driving TFT Td and an electrode of the storage capacitor Cst through the switching TFT Ts.

When the driving TFT Td is turned on by the data signal, an electric current flowing through the light emitting diode De is controlled, thereby displaying an image. The light emitting diode De emits light due to the current supplied through the driving TFT Td from the high voltage supply VDD.

Namely, the amount of the current flowing through the light emitting diode De is proportional to the magnitude of the data signal, and the intensity of light emitted by the light emitting diode De is proportional to the amount of the current flowing through the light emitting diode De. Thus, the sub-pixel P shows different gray levels depending on the magnitude of the data signal, and as a result, the EL display device displays an image.

In addition, the storage capacitor Cst maintains charges corresponding to the data signal for a frame when the switching TFT Ts is turned off. Accordingly, even if the switching TFT Ts is turned off, the storage capacitor Cst allows the amount of the current flowing through the light emitting diode De to be constant and the gray level shown by the light emitting diode De to be maintained until a next frame.

Meanwhile, one or more TFTs and/or capacitors can be added in each sub-pixel P in addition to the switching and driving TFT Ts and Td and the storage capacitor Cst.

For example, in the EL display device, the driving TFT Td is turned on for a relatively long time while the data signal is applied to the gate electrode of the driving TFT Td and the light emitting diode De emits light to thereby display the gray level. The driving TFT Td can deteriorate due to application of the data signal for a long time. Therefore, the mobility and/or threshold voltage Vth of the driving TFT Td are changed, and thus the sub-pixel P of the EL display device displays a different gray level with respect to the same data signal. This causes non-uniform luminance, thereby lowering the image quality of the EL display device.

Accordingly, to compensate for the change of the mobility and/or threshold voltage of the driving TFT Td, at least one sensing TFT and/or capacitor for sensing a voltage change can be further added in each sub-pixel P. The sensing TFT and/or capacitor can be connected to a reference line for applying a reference voltage and outputting a sensing voltage.

In the EL display device of the present disclosure, the light emitting diode De disposed in the emission area includes a first electrode, a light emitting layer and a second electrode. The first electrode, the light emitting layer and the second electrode can be sequentially formed on or over a substrate, and the switching TFT Ts, the driving TFT Td and the storage capacitor Cst can be formed between the substrate and the first electrode. In the EL display device, the light from the light emitting layer of the light emitting diode De is output toward a direction opposite the substrate through the second electrode. It can be referred to as a top emission type EL display device. Since the top emission type display device has the larger effective emission area than the bottom emission type display device such that the brightness of the display device is improved and the power consumption of the display device is decreased.

The EL display device includes a transparent area to be transparent. In the transparent area, the light, which passes through the substrate, should pass the second electrode. Accordingly, in the transparent EL display device, a reflection electrode is not presented in the transparent area.

In addition, in the transparent EL display device, the second electrode has to be formed to a relatively thin thickness with a metal material or has to be formed of a transparent conductive material in the top emission type display device such that light is output through the second electrode. Alternatively, the resistance of the second electrode is increased, and a voltage drop occurs due to the resistance of the second electrode, thereby causing a problem of non-uniform brightness.

Therefore, the transparent display device according to the embodiment of the present disclosure has a transparent area and includes an auxiliary electrode to reduce the resistance of the second electrode. The auxiliary electrode can be electrically connected to the second electrode through a transparent connection pattern disposed in the transparent area. In addition, the transparent connection pattern can be connected to the auxiliary electrode through an auxiliary pattern. Accordingly, a contact resistance between the auxiliary electrode and the second electrode is decreased by the transparent connection pattern such that the electrical property of the transparent EL display device is improved.

Figure 2:
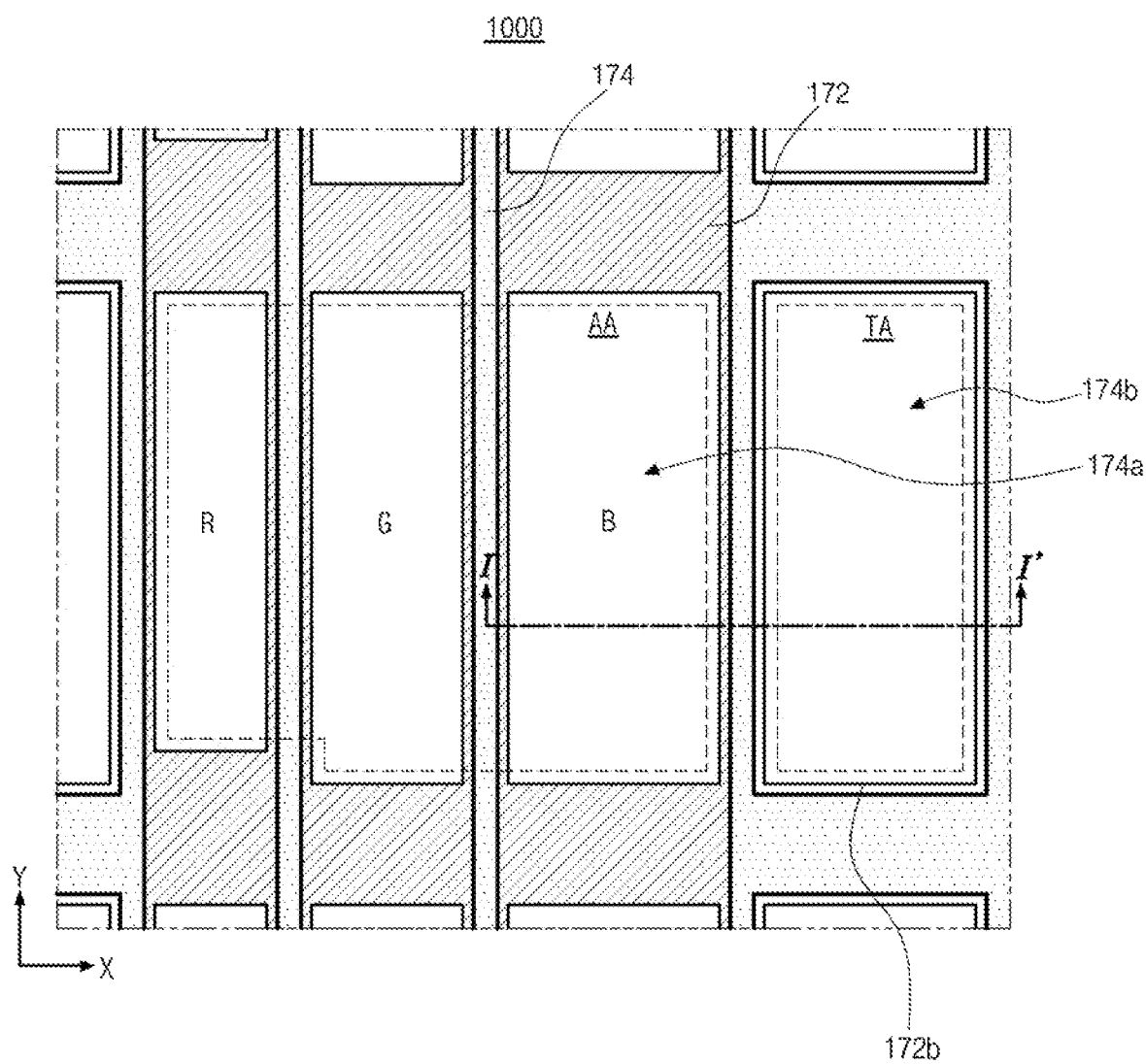
FIG. 2 is a schematic plan view of an EL display device according to an embodiment of the present disclosure.

FIG. 2 is a schematic plan view of one pixel, as an example, in an EL display 1000 device according to an embodiment of the present disclosure and mainly shows a bank configuration.

As shown in FIG. 2, in the EL display device 1000, one pixel includes an emission area AA and a transparent area TA. The EL display device 1000 can be referred to as a transparent EL display device. The EL display device 1000 includes red, green and blue sub-pixels R, G and B in the emission area AA and a transparent portion 174*b* in the transparent area TA, but other variations are possible. Each of the red, green and blue sub-pixels R, G and B can have the circuit diagram in FIG. 1.

The transparent portion 174*b* disposed in the transparent area TA can be positioned to be adjacent to the blue sub-pixel B. Particularly, the transparent portion 174*b* can be positioned between the blue sub-pixel B and the red sub-pixel R being adjacent to the blue sub-pixel B, e.g., the red sub-pixel R in the adjacent pixel. In this instance, the transparent portion 174*b* can have a difference in a circuit diagram from the red, green and blue sub-pixels R, G and B.

In the emission area AA, the red, green and blue sub-pixels R, G and B are sequentially arranged in a first direction, e.g., an X direction being a horizontal direction in FIG. 2, and the same color sub-pixels are arranged in a second direction, e.g., a Y direction, being perpendicular to the first direction. In FIG. 2, the red, green and blue sub-pixels R, G and B have a rectangular shape, but it is not limited thereto. For example, the red, green and blue sub-pixels R, G and B can have a various shape such as a rectangular shape with a rounded corner, an oval shape, and the like.

In the emission area AA, the red, green and blue sub-pixels R, G and B can have different areas (sizes). The area of each of the red, green and blue sub-pixels R, G and B can be determined depending on the lifespan of the light emitting diode in each of the sub-pixels R, G and B. For example, the area of the green sub-pixel G can be larger than that of the red sub-pixel R and smaller than that of the blue sub-pixel B, but it is not limited thereto. The red, green and blue sub-pixels R, G and B can have the same area or same size, or one dimension may vary, e.g., the widths of these sub-pixels can vary from each other.

With respect to the blue sub-pixel B, the transparent portion 174b is positioned in the first direction. A plurality of transparent portions 174b are repeatedly arranged in the second direction being perpendicular to the first direction. The transparent portions 174b arranged in the first direction can have different areas. The transparent portions 174b arranged in the second direction can have the same area.

In FIG. 2, the transparent portion 174b has a rectangular shape, but it is not limited thereto. For example, the transparent portion 174b can have a various shape such as a rectangular shape with a rounded corner, an oval shape, and the like.

The red, green and blue sub-pixels R, G and B in the emission area AA and the transparent portion 174b in the transparent area TA can be defined by a bank 172 and 174. The bank 172 and 174 includes a first bank 172 having a hydrophilic property and a second bank 174 having a hydrophobic property.

In more detail, the first bank 172 is positioned between adjacent sub-pixels of the same color arranged in the second direction and between adjacent sub-pixels of different colors in the first direction. The first bank 172 can be formed to surround each of the red, green and blue sub-pixels R, G and B.

In addition, the first bank 172 can be positioned between the blue sub-pixel B and the transparent portion 174b being adjacent to the blue sub-pixel B in the first direction. Moreover, the first bank 172 can be positioned between adjacent transparent portions 174b in the second direction. The first bank 172 can be formed to surround each transparent portion 174b.

The second bank 174 is formed on or over the first bank 172 in the emission area AA. In addition, the second bank 174 is formed on or over the first bank 172 in the transparent area TA and can be formed on the transparent connection pattern. The second bank 174 can include a transparent conductive material. Accordingly, the transparent connection pattern and the second electrode can be electrically connected to each other by the second bank 174. The second bank 174 can be formed on an entire surface of the transparent portion 174b in the transparent area TA. As a result, the second bank 174 can cover the transparent portion 174b. Namely, the second bank 174 is presented in the transparent portion 174b, while the first bank 172 is not presented in the transparent portion 174b.

The second bank 174 has an opening 174a corresponding to the sub-pixel column of the sub-pixels having the same color. In the second bank 174, a length along the second direction, i.e., the Y direction, is greater than a length, i.e., a width, along the first direction, i.e., the X direction. The opening 174a includes a minor side being parallel to the first direction and a major side being parallel to the second direction. In this instance, in a space between adjacent two sub-pixels of the sub-pixels R, G and B being adjacent to each other in the first direction, the second bank 174 can have a width being narrower than the first bank 172.

The first bank 172 includes an auxiliary contact hole 172b corresponding to the transparent portion 174b.

In one pixel, the auxiliary contact hole 172b can be formed to correspond to the transparent portion 174b being adjacent to the blue sub-pixel B. The auxiliary contact hole 172b can be positioned between the blue sub-pixel B in one pixel and the red sub-pixel R in adjacent pixel. In addition, the auxiliary contact hole 172b can be formed to further correspond to a space between adjacent blue sub-pixels B in the second direction. However, it is not limited thereto, and a position and an area of the auxiliary contact hole 172b can vary.

The transparent connection pattern is formed to correspond to the transparent portion 174b, where the auxiliary contact hole 172b is formed, and is exposed through the auxiliary contact hole 172b. The exposed portion of the transparent connection pattern can be covered with the second bank 174. As described above, the second bank 174 can include the transparent conductive material. Accordingly, the transparent connection pattern connects the second electrode and the auxiliary electrode through the second bank 174. In addition, the transparent connection pattern and the auxiliary electrode can be connected to an auxiliary pattern.

A cross-sectional structure of the EL display device 1000 according to the present disclosure will be described in detail with reference to FIG. 3.

Figure 3:
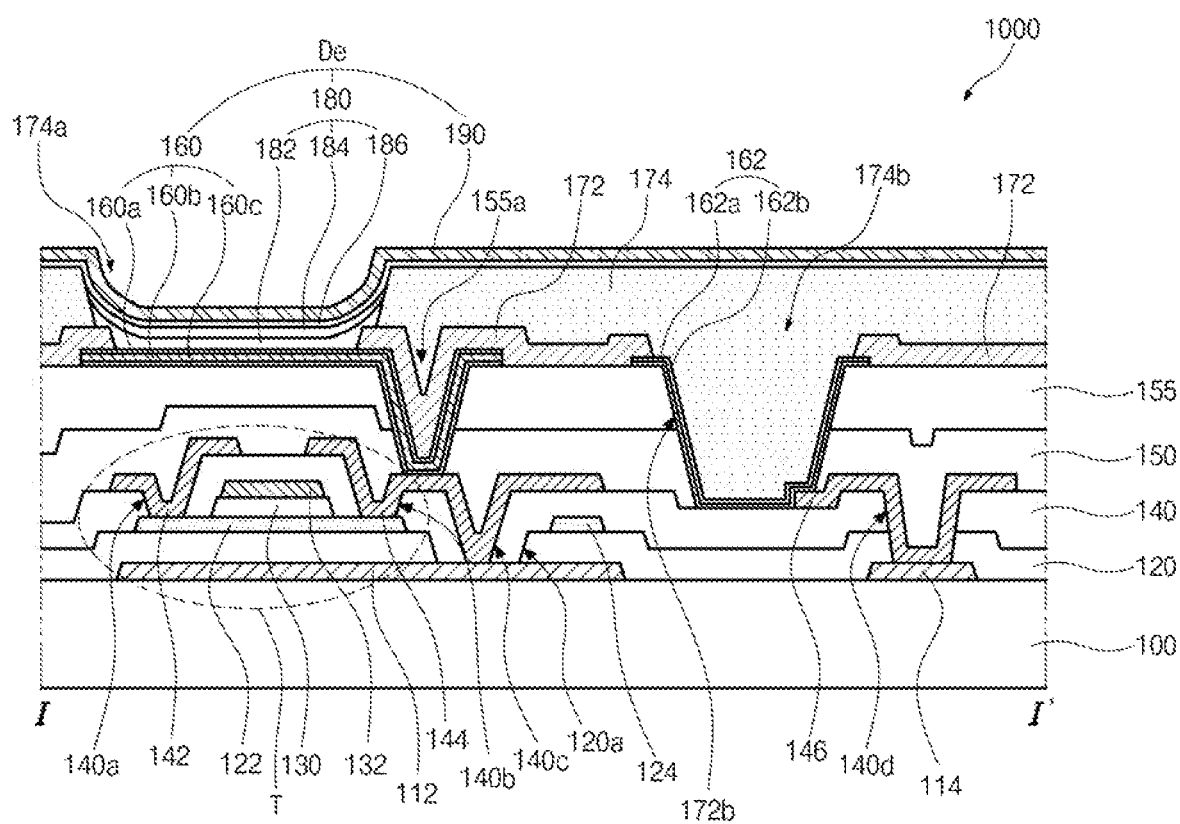
FIG. 3 is a schematic cross-sectional view of the EL display device and corresponds to the line I-I' of FIG. 2.

FIG. 3 is a schematic cross-sectional view of the EL display device and corresponds to the line I-I' of FIG. 2.

As shown in FIG. 3, in the EL display device 1000, a light shielding pattern (or a light blocking pattern) 112 and the auxiliary electrode 114, which is formed of a first conductive material, are formed on the substrate 100. The first conductive material can be a metal. The substrate can be a glass substrate or a plastic substrate. For example, the plastic substrate can be a polyimide substrate, but it is not limited thereto.

The light shielding pattern 112 and the auxiliary electrode 114 can be formed of at least one of aluminum (Al), copper (Cu), molybdenum (Mo), titanium (Ti), chromium (Cr), nickel (Ni), tungsten (W) or their alloys and can have a single-layered structure or a multi-layered structure. For example, the light shielding pattern 112 and the auxiliary electrode 114 can have a double-layered structure including a lower layer of a molybdenum-titanium alloy (MoTi) and an upper layer of copper (Cu), and the upper layer can have a thicker thickness than the lower layer.

The auxiliary electrode 114 can extend along the first direction, i.e., the X direction, and/or the second direction, i.e., the Y direction. For example, the auxiliary electrode 114 can extend along the first direction to correspond to the plurality of pixel arranged along the first direction. Alternatively, the auxiliary electrode 114 can extend along the second direction, which is perpendicular to the first direction, to correspond to the plurality of pixel arranged along the second direction. In addition, the auxiliary electrode 114 can extend along the first and second directions to have a lattice structure (or shape). However, it is not limited thereto.

A buffer layer 120 is formed on the light shielding pattern 112 and the auxiliary electrode 114 substantially on an entire surface of the substrate 100. The buffer layer 120 can be formed of an inorganic insulating material such as silicon oxide (SiO$_2$) or silicon nitride (SiNx) and can be formed as a single layer or multi layers.

The buffer layer 120 has a buffer hole 120a on the light shielding pattern 112, and a part of a top surface of the light shielding pattern 112 is exposed through the buffer hole 120a.

A semiconductor layer 122 and a capacitor electrode 124 are patterned and formed on the buffer layer 120. The semiconductor layer 122 and the capacitor electrode 124 are spaced apart from each other over the light shielding pattern 112. The light shielding pattern 112 blocks light incident on the semiconductor layer 122 and prevents the semiconductor layer 122 from deteriorating due to the light.

The semiconductor layer 122 and the capacitor electrode 124 can be formed of polycrystalline silicon, and in this case, the capacitor electrode 124 and both ends of the semiconductor layer 122 can be doped with impurities. Alternatively, the semiconductor layer 122 and the capacitor electrode 124 can be formed of an oxide semiconductor material.

A gate insulation layer 130 of an insulating material and a gate electrode 132 of a second conductive material such as metal are sequentially formed on the semiconductor layer 122. The gate insulation layer 130 and the gate electrode 132 are disposed to correspond to a center of the semiconductor layer 122.

The gate insulation layer 130 can be formed of an inorganic insulating material such as silicon oxide (SiO$_2$) or silicon nitride (SiNx). When the semiconductor layer 122 is made of an oxide semiconductor material, it is preferable that the gate insulation layer 130 is formed of silicon oxide (SiO$_2$).

The gate electrode 132 can be formed of at least one of aluminum (Al), copper (Cu), molybdenum (Mo), titanium (Ti), chromium (Cr), nickel (Ni), tungsten (W) or their alloys and can have a single-layered structure or a multi-layered structure. For example, the gate electrode 132 can have a double-layered structure including a lower layer of a molybdenum-titanium alloy (MoTi) and an upper layer of copper (Cu), and the upper layer can have a thicker thickness than the lower layer.

As shown in FIG. 3, the gate insulation layer 130 can be patterned to have the same shape as the gate electrode 132. At this time, a width of the gate insulation layer 130 can be wider than a width of the gate electrode 132, and thus, edges of a top surface of the gate insulation layer 130 can be exposed. Alternatively, the width of the gate insulation layer 130 can be the same as the width of the gate electrode 132.

Alternatively, the gate insulation layer 130 may not be patterned and can be formed substantially over the entire surface of the substrate 100.

Meanwhile, a gate line can be further formed of the same material and on the same layer as the gate electrode 132. The gate line can extend along the first direction. When the auxiliary electrode 114 extends along the first direction, the gate line and the auxiliary electrode 114 can be parallel to each other.

An interlayer insulation layer 140 made of an insulating material is formed on the gate electrode 132 substantially over the entire surface of the substrate 100. The interlayer insulation layer 140 can be formed of an inorganic insulating material such as silicon oxide (SiO$_2$) or silicon nitride (SiNx). Alternatively, the interlayer insulation layer 140 can be formed of an organic insulating material such as photo acryl or benzocyclobutene.

The interlayer insulation layer 140 has first, second, third and fourth contact holes 140a, 140b, 140c and 140d. The first and second contact holes 140a and 140b expose the both ends of the semiconductor layer 122. The third contact hole 140c exposes the part of the top surface of the light shielding pattern 112 and is located in the buffer hole 120a. Alternatively, the buffer hole 120a can be omitted, and the third contact hole 140c can be formed in the buffer layer 120 as well as in the interlayer insulation layer 140 to expose the part of the top surface of the light shielding pattern 112. The fourth contact hole 140d is formed in the buffer layer 120 as well as in the interlayer insulation layer 140 to expose a part of a top surface of the auxiliary electrode 114.

Source and drain electrodes 142 and 144 and the auxiliary pattern 146 made of a third conductive material such as metal are formed on the interlayer insulation layer 140. The source and drain electrodes 142 and 144 and the auxiliary pattern 146 can be formed of at least one of aluminum (Al), copper (Cu), molybdenum (Mo), titanium (Ti), chromium (Cr), nickel (Ni), tungsten (W) or their alloys and can have a single-layered structure or a multi-layered structure. For example, the source and drain electrodes 142 and 144 and the auxiliary pattern 146 can have a double-layered structure including a lower layer of a molybdenum-titanium alloy (MoTi) and an upper layer of copper (Cu), and the upper layer can have a thicker thickness than the lower layer. Alternatively, the source and drain electrodes 142 and 144 and the and the auxiliary pattern 146 can have a triple-layered structure.

The source and drain electrodes 142 and 144 contact the both ends of the semiconductor layer 122 through the first and second contact holes 140a and 140b, respectively. Further, the drain electrode 144 contacts the light shielding pattern 112 through the third contact hole 140c and overlaps the capacitor electrode 124. The capacitor electrode 124 overlaps the light shielding pattern 112 and the drain electrode 144 to form a storage capacitor.

Meanwhile, the auxiliary pattern 146 overlaps the auxiliary electrode 114 and contacts the auxiliary electrode 114 through the fourth contact hole 140d. The auxiliary pattern 146 extends along the second direction to correspond to the plurality of transparent areas TA arranged in the second direction, but it is not limited thereto.

In addition, a data line and a high voltage supply line can be further formed on the interlayer insulation layer 140 and can be made of the third conductive material. The data line and the high voltage supply line can extend along the second direction. As a result, the data line and the high voltage supply line can be parallel to each other.

The semiconductor layer 122, the gate electrode 132, and the source and drain electrodes 142 and 144 form a TFT T. The TFT T has a coplanar structure in which the gate electrode 132 and the source and drain electrodes 142 and 144 are located over the semiconductor layer 122.

Alternatively, the TFT T can have an inverted staggered structure. For example, the gate electrode can be disposed under the semiconductor layer, and the source and drain electrodes can be disposed over the semiconductor layer. In this case, the semiconductor layer can be formed of oxide semiconductor or amorphous silicon.

The TFT T corresponds to a driving TFT Td (of FIG. 1), and a switching TFT Ts (of FIG. 1) having the same structure as the driving TFT Td can be further formed on the substrate 100.

A passivation layer 150 of an insulating material is formed on the source and drain electrodes 142 and 144 and the auxiliary pattern 146 substantially over the entire surface of the substrate 100. The passivation layer 150 can be formed of an inorganic insulating material such as silicon oxide ($SiO_2$) or silicon nitride (SiNx).

Next, an overcoat layer 155 of an insulating material is formed on the passivation layer 150 substantially over the entire surface of the substrate 100. The overcoat layer 155 can be formed of an organic insulating material such as photo acryl or benzocyclobutene. The overcoat layer 155 can eliminate level differences due to under layers and have a substantially flat top surface.

One of the passivation layer 150 and the overcoat layer 155 can be omitted. For example, the passivation layer 150 can be omitted, but is not limited thereto.

The passivation layer 150 and the overcoat layer 155 have a drain contact hole 155a exposing the drain electrode 144. Further, the passivation layer 150 and the overcoat layer 155 have an auxiliary contact hole 172b exposing the auxiliary pattern 146. In this case, a part of the auxiliary pattern 146 can be exposed through the auxiliary contact hole 172b, and the part of the auxiliary pattern 146 can protrude toward the auxiliary contact hole 172b. Namely, the part, i.e., an end, of the auxiliary pattern 146 is positioned in the auxiliary contact hole 172b. Accordingly, the protruding part of the auxiliary pattern 146 can contact the transparent connection pattern 162.

A first electrode 160 is formed on the overcoat layer 155 in the emission area AA. The first electrode 160 has a relatively high work function and contacts the drain electrode 144 through the drain contact hole 155a.

The first electrode 160 includes a first layer 160a and a second layer 160b. The second layer 160b is disposed between the first layer 160a and the substrate 100, more particularly, between the first layer 160a and the overcoat layer 155.

The first layer 160a is formed of a conductive material having high work function. For example, the first layer 160a can be formed of a transparent conductive material such as indium-tin-oxide (ITO) or indium-zinc-oxide (IZO). The second layer 160b is formed of a metallic material having low work function. For example, the second layer 160b can be formed of silver (Ag). The work function of the first layer 160a is higher than that of the second layer 160b.

A thickness of the second layer 160b can be greater than that of the first layer 160a. For example, the thickness of the second layer 160b can be 80 to 100 nm, and the thickness of the first layer 160a can be 10 to 80 nm.

The first electrode 160 can further include a third layer 160c between the second layer 160b and the overcoat layer 155. The third layer 160c is formed to improve the adhesion property between the second layer 160b and the overcoat layer 155 and can be omitted. The third layer 160c can be formed of a transparent conductive material such as ITO or IZO.

A thickness of the third layer 160c can be smaller than that of the second layer 160b and can be equal to or smaller than that of the first layer 160a. For example, the thickness of the third layer 160c can be 10 nm, but it is not limited thereto.

The transparent connection pattern 162 is formed on the overcoat layer 155 in the transparent area TA. The transparent connection pattern 162 covers the protruding part of the auxiliary pattern 146 in the auxiliary contact hole 172b. Since the auxiliary pattern 146 contacts and is electrically connected to the auxiliary electrode 114, the transparent connection pattern 162 is electrically connected to the auxiliary electrode 114 through the auxiliary pattern 146.

The transparent connection pattern 162 has a double-layered structure. Namely, the transparent connection pattern 162 includes a first layer 162a and a second layer 162b. In the transparent connection pattern 162, the second layer 162b and the first layer 162a are sequentially stacked such that the first layer 162a is positioned on the second layer 162b.

The first layer 162a of the transparent connection pattern 162 can be simultaneously formed with the first layer 160a of the first electrode 160 in the emission area AA. The second layer 162b of the transparent connection pattern 162 can be simultaneously formed with the third layer 160c of the first electrode 160 in the emission area AA. The first layer 162a of the transparent connection pattern 162 can be formed of the same material as the first layer 160a of the first electrode 160 in the emission area AA, and the second layer 162b of the transparent connection pattern 162 can be formed of the same material as the third layer 160c of the first electrode 160 in the emission area AA. As described above, each of the first and third layers 160a and 160c of the first electrode 160 can be formed of the transparent conductive material. Namely, the first electrode 160 includes the second layer 160b formed of a metallic material having high reflectance, e.g., Ag, while each of the first and second layers 162a and 162b of the transparent connection pattern 162 is formed of the transparent conductive material. As a result, the transmittance in the transparent portion 174b is secured.

In FIG. 3, the first electrode 160 has a triple-layered structure of the first to third layers 160a to 160c, and the transparent connection pattern 162 has a double-layered structure of the first and second layers 162a and 162b. Namely, the second layer 160b is disposed between the first and second layers 160a and 160b such that the first and second layers 160a and 160c are not in contact with each other, while the first and second layers 162a and 162b contact each other. Alternatively, when the first electrode 160 has a double-layered structure of the first and second layers 160a and 160b, the transparent connection pattern 162 can have a single-layered structure of the first layer 162a.

Each of the first and second layers 162a and 162b of the transparent connection pattern 162 is formed of a conductive material having high work function. For example, each of the first and second layers 162a and 162b of the transparent connection pattern 162 can be formed of a transparent conductive material such as ITO or IZO.

The bank 172 and 174 is formed on the first electrode 160 and the transparent connection pattern 162. The bank 172 and 174 includes the first bank 172 having a hydrophilic property and the second bank 174 having a hydrophobic property.

In more detail, in the emission area AA, the first bank 172 overlaps an edge of the first electrode 160. The first bank 172 covers the edge of the first electrode 160 and exposes a center portion of the first electrode 160. The first bank 172 contacts the edge of the first electrode 160. In addition, the first bank 172 is formed on the transparent connection pattern 162 to cover an edge of the transparent connection pattern 162 and expose the transparent connection pattern 162. For example, the first bank 172 exposes at least a portion, e.g., a center portion, of the transparent connection pattern 162. Namely, the transparent connection pattern 162 corresponding to the auxiliary contact hole 172b is exposed by the first bank 172.

The first bank 172 can be formed of a material having a hydrophilic property, for example, an inorganic insulating material such as silicon oxide ($SiO_2$) or silicon nitride (SiNx). Alternatively, the first bank 172 can be formed of polyimide.

The second bank 174 is formed on the first bank 172. At least a top surface of the second bank 174 is hydrophobic, and a side surface of the second bank 174 can be hydrophobic or hydrophilic.

In the transparent area TA, the second bank 174 is formed on the transparent connection pattern 162. The second bank 174 can cover the transparent connection pattern 162 in region corresponding to the auxiliary contact hole 172b. Namely, the second bank 174 can cover the transparent portion 174b. The second bank 174 is formed of a transparent conductive material. As a result, the transmittance of the transparent area TA can be secured by the second bank 174, and the transparent connection pattern 162 and the second electrode 190 can be electrically connected to each other by the second bank 174.

The conductive material of the second bank 174 can include a conductive polymer. For example, the second bank 174 can be formed of the conductive polymer, a hydrophilic organic material and a hydrophobic material. The conductive polymer can be PEDOT:PSS, and the hydrophilic organic material can be a polymer such as polyimide. The hydrophobic material can be a material including fluorine.

Alternatively, the second bank 174 can include the conductive polymer and a hydrophobic material without a hydrophilic organic material. However, the material of the second bank 174 is not limited thereto.

In addition, the second bank 174 can be formed of a single organic material having a conductive property and a hydrophobic property. For example, polythiophene, which is a hydrophobic organic material being capable of providing an electrical connection, can be used to form the second bank 174.

In the emission area AA, the second bank 174 has an opening 174a exposing the center portion of the first electrode 160. As described above, in the emission area AA, the second bank 174 can be formed between adjacent sub-pixels having different colors, and the opening 174a of the second bank 174 can correspond to the sub-pixel column of the sub-pixels having the same color.

In the emission area AA, the second bank 174 has a narrower width than the first bank 172 and is disposed on the first bank 172 to exposes an edge of the first bank 172. In addition, the second bank 174 can have a thicker thickness than the first bank 172.

A light emitting layer 180 is formed on the first electrode 160 exposed through the opening 174a. The light emitting layer 180 can include a first charge auxiliary layer 182, an emitting material layer 184, and a second charge auxiliary layer 186 that are sequentially positioned over the first electrode 160. The emitting material layer 184 can be formed of one of red, green and blue emitting materials, but it is not limited thereto. The emitting material can be an organic emitting material such as a phosphorescent compound or a fluorescent compound or an inorganic emitting material such as a quantum dot.

The first charge auxiliary layer 182 can be a hole auxiliary layer, and the hole auxiliary layer can include at least one of a hole injecting layer (HIL) and a hole transporting layer (HTL). In addition, the second charge auxiliary layer 186 can be an electron auxiliary layer, and the electron auxiliary layer can include at least one of an electron injecting layer (EIL) and an electron transporting layer (ETL). However, the present disclosure is not limited thereto.

Each of the first charge auxiliary layer 182 and the emitting material layer 184 can be formed through a solution process. Thus, the process can be simplified, and a display device with a large size and high resolution can be provided.

A spin coating method, an ink jet printing method, or a screen printing method can be used as the solution process, but it is not limited thereto.

As described above, since the opening 174a of the transparent second bank 174 corresponds to the sub-pixel column of the same color sub-pixels, the dropped solutions by different nozzles in the same color sub-pixels are connected. The dropped solution is dried to form the first charge auxiliary layer 182 and the emitting material layer 184. As a result, the first charge auxiliary layers 182 and the emitting material layers 184 in the same color sub-pixels are respectively continuous and connected to each other as one-body. Namely, the first charge auxiliary layers 182 and the emitting material layers 184 in the emission area, e.g., a first emission area, AA are respectively continuous and connected to the first charge auxiliary layers 182 and the emitting material layers 184 in another emission area, e.g., a second emission area. Accordingly, the deviation of the drop amount of the nozzle is minimized, and the thickness of thin films in the sub-pixel is uniformed.

When the solution is dried, the evaporation rate of the solution is different in a portion being adjacent to the transparent second bank 174 and in other portions. Namely, the evaporation rate of the solution in the portion being adjacent to the transparent second bank 174 is greater than that in the other portions, and a height of the first charge auxiliary layer 182 and the emitting material layer 184 in the portion being adjacent to the transparent second bank 174 becomes higher as it approaches the transparent second bank 174. At least one side surface of each of the first charge auxiliary layer 182 and the emitting material layer 184 can be surrounded by the second bank 174.

On the other hand, the second charge auxiliary layer 186 can be formed through a thermal evaporation process such that the second charge auxiliary layer 186 is formed substantially over the entire surface of the substrate 100. Namely, the second charge auxiliary layer 186 can be formed on an upper surface and a side surface of the transparent second bank 174 in the transparent area TA and the emission area AA.

Over the light emitting layer 180, particularly on the second charge auxiliary layer 186, the second electrode 190, which is formed of a conducive material having low work function, is formed substantially over the entire surface of the substrate 100. The second electrode 190 can be formed Al, Mg, Ag or their alloys. The second electrode 190 has a relatively thin thickness such that the light from the light emitting layer 180 can be transmitted therethrough. For example, the second electrode 190 can have the thickness of 5 nm to 10 nm.

Alternatively, the second electrode 190 can be formed of a transparent conductive material such as indium-gallium-oxide (IGO) or IZO.

The second electrode 190 in the transparent area AA is positioned on the second bank 174. Since the second bank 174 includes the conductive material, the second electrode 190 is electrically connected to the transparent connection pattern 162 through the second bank 174. The second charge auxiliary layer 186 can be positioned between the second electrode 190 and the second bank 174.

Since the second charge auxiliary layer 186 has an insulating property and can serve as a resistance, the voltage drop can be generated. However, since the second bank 174 of the present disclosure includes the conductive material to be conductive, the electrical connection between the second electrode 190 and the transparent connection pattern 162 is improved such that the voltage drop by layers between the transparent connection pattern 162 and the second electrode 190 can be minimized. Accordingly, the second bank 174 enables the electrical connection between the second electrode 190 and the transparent connection pattern 162 and minimizes the voltage drop such that the light emission in each emission area AA can be uniformed.

The first electrode 160, the light emitting layer 180 and the second electrode 190 constitute a light emitting diode De. The first electrode 160 can serve as an anode, and the second electrode 190 can serve as a cathode, but is not limited thereto.

As described above, the EL display device 1000 according to the embodiment of the present disclosure can be a top emission type in which the light from the light emitting layer 180 of the light emitting diode De is output toward a direction opposite the substrate 100, for example, output to the outside through the second electrode 190. The top emission type display device can have a wider emission area than a bottom emission type display device of the same size such that the brightness of the EL display device 1000 can be improved and the power consumption can be reduced.

The light emitting diode De of each emission area AA can have an element thickness for a micro-cavity effect depending on a wavelength of the emitted light, thereby increasing the light efficiency.

A capping layer can be formed on the second electrode 190 substantially over the entire surface of the substrate 100. The capping layer can be formed of an insulating material having a relatively high refractive index. The wavelength of light traveling in the capping layer can be amplified by surface plasma resonance, and thus the intensity of the peak can be increased. As a result, the light efficiency in the top emission type EL display device can be improved. For example, the capping layer can be formed as a single layer of an organic layer or an inorganic layer or formed as organic/inorganic stacked layers.

In the EL display device 1000 according to the embodiment of the present disclosure, by forming a part of the light emitting layer 180 through the solution process, a fine metal mask can be omitted and the production cost can be reduced. A display device with a large size and high resolution can be provided.

In addition, since the EL display device 100 is operated by the top emission type, the brightness can be improved and the power consumption can be reduced. Since the second electrode 190 is formed to have the relatively thin thickness in order to transmit light, the resistance of the second electrode 190 can be increased. However, in the EL display device 1000 of the present disclosure, the resistance of the second electrode 190 can be lowered by connecting the second electrode 190 to the auxiliary electrode 114 through the transparent second bank 174, the transparent connection pattern 162 and the auxiliary pattern 146. As a result, the electrical connection between the second electrode 190 and the auxiliary electrode 114 is improved, and the voltage drop in each pixel is minimized. Accordingly, the light emission in each emission area AA can be uniformed.

Figure 4:
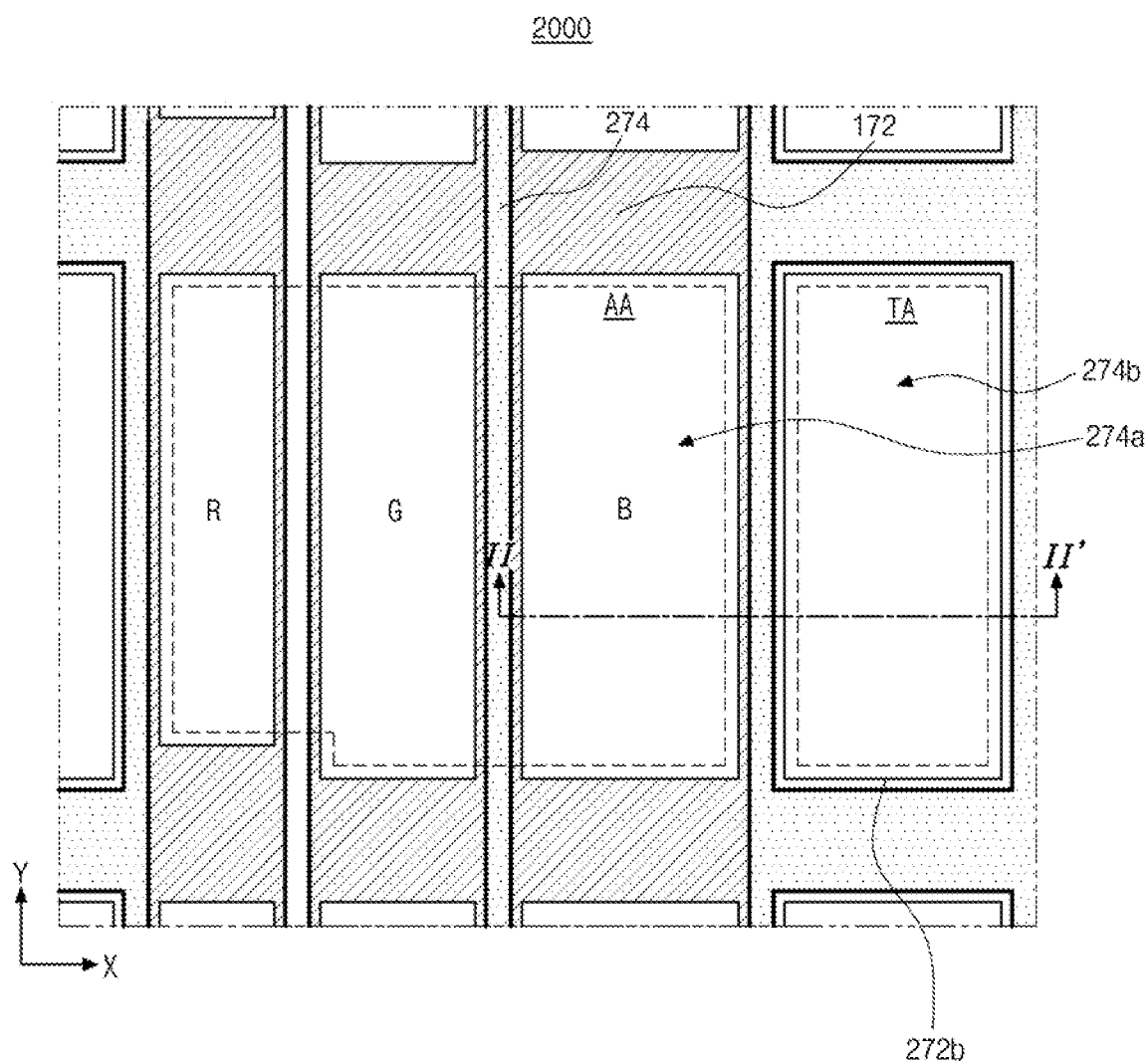
FIG. 4 is a schematic plan view of an EL display device according to another embodiment of the present disclosure.
Figure 5:
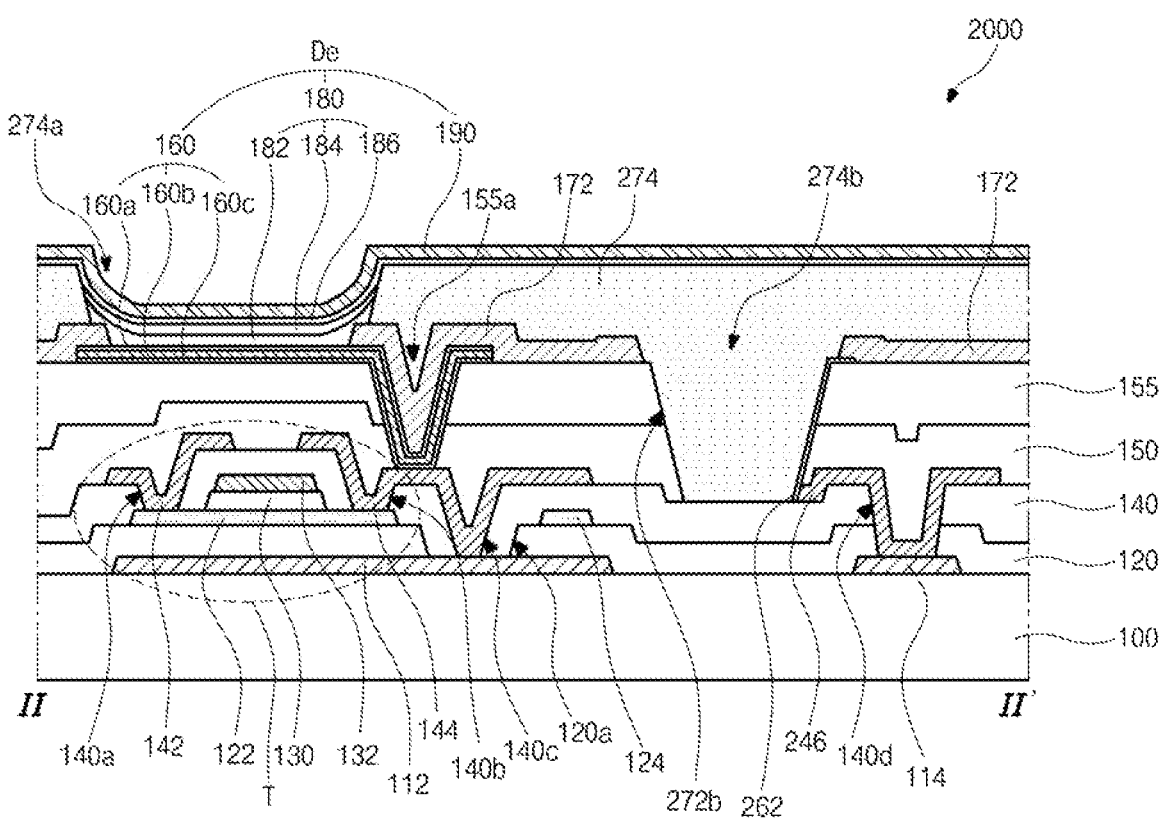
FIG. 5 is a schematic cross-sectional view of the EL display device and corresponds to the line II-IF of FIG. 4.

FIG. 4 is a schematic plan view of an EL display device 2000 according to another embodiment of the present disclosure, and FIG. 5 is a schematic cross-sectional view of the EL display device 2000 and corresponds to the line II-IF of FIG. 4. The EL display device 2000 has the same configuration as that in the EL display device 1000 shown in FIGS. 2 and 3, except for a transparent portion 274b in the transparent area TA. The same elements are designated by the same reference signs, and explanation for the same elements will be shortened or omitted.

In the EL display device 2000 in the embodiment of the present disclosure shown in FIGS. 4 and 5, an auxiliary pattern 246 does not protrude. In detail, the overcoat layer 155 and the passivation layer 150 includes an auxiliary contact hole 272b exposing the auxiliary pattern 246. In this instance, a surface of the auxiliary pattern 246 can be exposed toward the auxiliary contact hole 272b. Namely, the auxiliary pattern 246 does not protrude into the auxiliary contact hole 272b, and the exposed surface of the auxiliary pattern 246 can coincide with a side surface, i.e., an inclined surface, of the passivation layer 150 and the overcoat layer 155 in the auxiliary contact hole 272b. The transparent connection pattern 262 is formed on the overcoat layer 155 in the transparent area TA and extends into a part of the inclined surface of the passivation layer 150 and the overcoat layer 155 in the auxiliary contact hole 272b. Namely, the transparent connection pattern 262 is formed at a part of the auxiliary contact hole 272b and contact the exposed surface of the auxiliary pattern 246. As a result, the transparent connection pattern 262 is electrically connected to the auxiliary pattern 246. Since the transparent connection pattern 262 and the auxiliary pattern 246 are formed in a part of the transparent portion 274b, the transmittance in the transparent portion 274b is further improved.

The transparent connection pattern 262 in the inclined surface of the passivation layer 150 and the overcoat layer 155 has a single-layered structure. The transparent connection pattern 262 having the single-layered structure can be simultaneously formed with the first layer 160a or the third layer 160c of the first electrode 160. The transparent connection pattern 262 having the single-layered structure can be formed of the same material as the first layer 160a or the third layer 160c of the first electrode 160. Each of the first layer 160a or the third layer 160c of the first electrode 160 can be formed of a transparent conductive material. Namely, the first layer 160a or the third layer 160c of the first electrode 160 and the transparent connection pattern 262 can be formed of the same material, the transmittance in the transparent portion 274b can be further secured by the transparent connection pattern 262 having the single-layered structure.

The transparent connection pattern 262 is formed of a conductive material having high work function. For example, the transparent connection pattern 262 can be formed of a transparent conductive material such as ITO or IZO.

In the transparent area TA, the second bank 274 is formed on the transparent connection pattern 262. The second bank 274 can cover the transparent connection pattern 162 formed on the inclined surface of the passivation layer 150 and the overcoat layer 155 in the auxiliary contact hole 272b. In addition, in the auxiliary contact hole 272b, the second bank 274 is formed on and contact the interlayer insulating layer 140. Namely, the second bank can cover the transparent portion 274b. The second bank 274 is formed of a transparent conductive material. As a result, the transparent connection pattern 262 and the second electrode 190 can be electrically connected to each other by the second bank 274.

Figure 6:
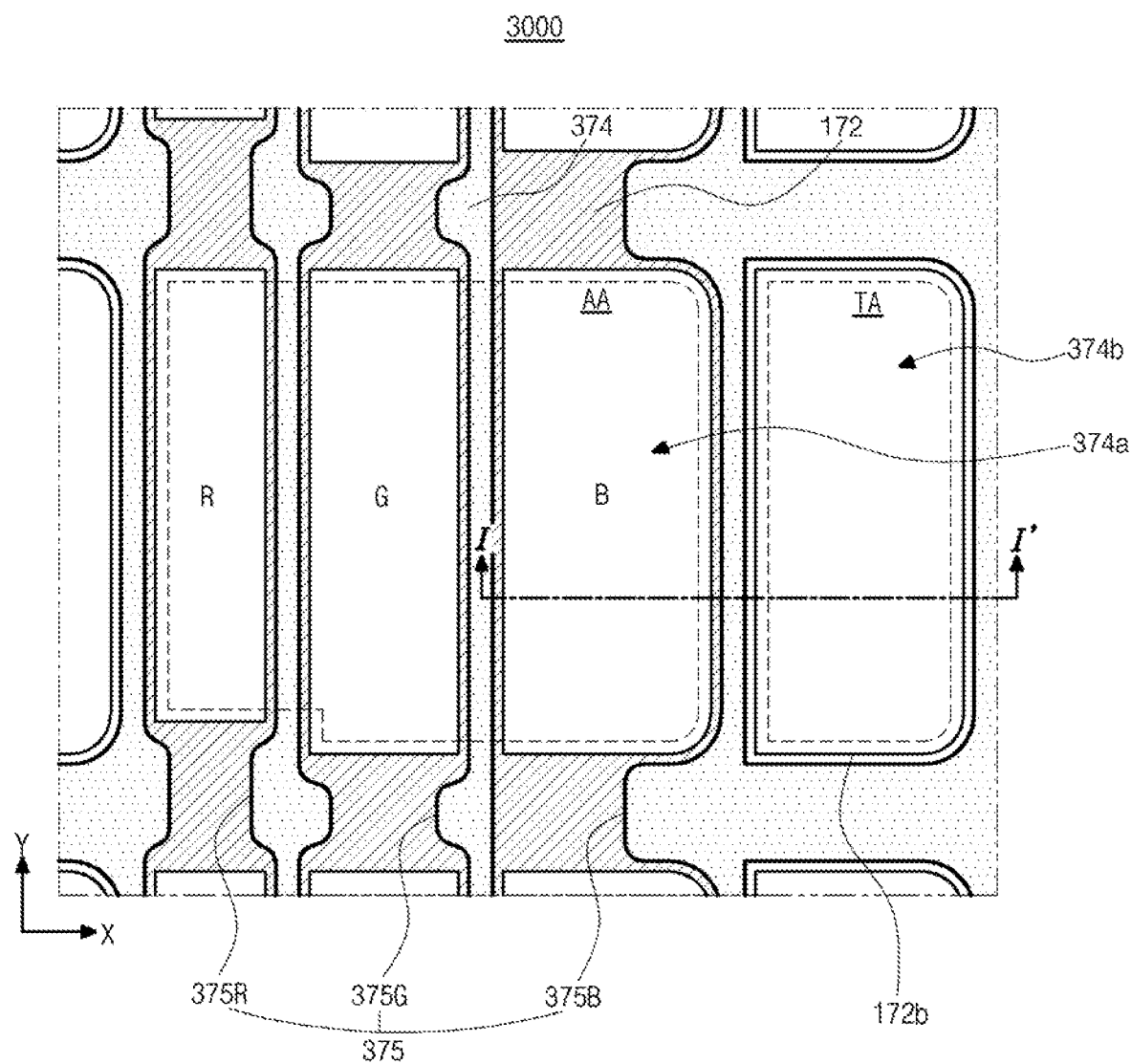
FIG. 6 is a schematic plan view of an EL display device according to another embodiment of the present disclosure.

FIG. 6 is a schematic plan view of an EL display device 3000 according to another embodiment of the present disclosure. The EL display device 3000 has the same configuration as that in the EL display device 1000 shown in FIGS. 2 and 3, except for a second bank 374. The same elements are designated by the same reference signs, and explanation for the same elements will be shortened or omitted. The cross-sectional view in FIG. 3 can correspond to and can be the view along the line I-I' of FIG. 6.

The second bank 374 in the emission area AA is formed on the first bank 172 and includes a transparent conductive material. In addition, the second bank 374 in the transparent area AA is formed on the first bank 172 and the transparent connection pattern. The second bank 374 includes a transparent conductive material such that the transparent connection pattern and the second electrode is electrically connected to each other by the second bank 374. The second bank 374 can be formed on an entire surface of the transparent portion 374b in the transparent area TA and can cover the transparent portion 374b.

The second bank 374 has an opening 374a corresponding to the sub-pixel column of the sub-pixels having the same color and is positioned between adjacent two of the sub-pixels R, G and B arranged in the first direction, i.e., the X direction.

The opening 374a of the second bank 374 extends along the second direction, i.e., the Y direction. In the second bank 374, a length along the second direction, i.e., the Y direction, is greater than a length, i.e., a width, along the first direction, i.e., the X direction. The opening 374a includes a minor side being parallel to the first direction and a major side being parallel to the second direction. In this instance, in a space between adjacent two sub-pixels of the sub-pixels R, G and B being adjacent to each other in the first direction, the second bank 374 can have a width being narrower than the first bank 172.

At least one side of the second bank 374 can include an extension part 375 extending along the first direction. The extension part 375 is positioned between adjacent two of the sub-pixels arranged in the second direction and having the same color and can overlap the first bank 172. The distance between the second bank 374 along the first direction is reduced by the extension part 375 such that the flow of the solution can be controlled and the light emitting layer can be formed to be further uniformed.

The size of the extension part 375 can be depend on a size (or an area) of the sub-pixels R, G and B.

In detail, the size of the blue sub-pixel B can be greater than that of the green sub-pixel G, and the size of the green sub-pixel G can be greater than that of the red sub-pixel R. In this instance, the sub-pixels R, G and B can have different width along the first direction, i.e., the X direction, and the width of the blue sub-pixel B can be greater than that of each of the red and green sub-pixels R and G.

Accordingly, an area between adjacent blue sub-pixels B can be greater than that between adjacent green sub-pixels G, and an area between adjacent red sub-pixels R can be smaller than that between adjacent green sub-pixels G.

The larger the area of the sub-pixel, the greater the amount of the solution is applied to the emission area AA. Accordingly, the size of the extension part 375 provided in the second bank 374 can be different according to the area of each of the sub-pixel R, G, and B so that a uniform light emitting layer can be formed by controlling the flow of the solution.

The second bank 374, which is positioned between the blue sub-pixel B and the transparent portion 374b, protrudes into a space between adjacent blue sub-pixels B being adjacent in the second direction, i.e., the Y direction, to form a first extension part 375B, e.g., a blue sub-pixel extension part. The second bank 374, which is positioned between the blue sub-pixel B and the green sub-pixel G, protrudes into a space between adjacent green sub-pixels G being adjacent in the second direction, i.e., the Y direction, to form a second extension part 375G, e.g., a green sub-pixel extension part. The second bank 374, which is positioned between the green sub-pixel G and the red sub-pixel R, protrudes into a space between adjacent red sub-pixels R being adjacent in the second direction, i.e., the Y direction, to form a third extension part 375R, e.g., a red sub-pixel extension part.

The area of the first extension part 375B can be greater than that of the second extension part 375G. Namely, an extension length of the first extension part 375B toward a space between adjacent blue sub-pixels B can be greater than that of the second extension part 375G toward a space between adjacent green sub-pixels G.

In addition, the area of the second extension part 375G can be greater than that of the third extension part 375R. Namely, an extension length of the second extension part 375G toward a space between adjacent green sub-pixels G can be greater than that of the third extension part 375R toward a space between adjacent red sub-pixels R. Since a size of the red sub-pixel R is smaller than that of each of the green sub-pixel G and the blue sub-pixel B, the third extension part 375R, which has relatively small extension length, can be positioned between adjacent red sub-pixels R.

It will be apparent to those skilled in the art that various modifications and variations can be made in a device of the present disclosure without departing from the sprit or scope of the embodiments. Thus, it is intended that the present disclosure covers the modifications and variations of this invention provided they come within the scope of the appended claims and their equivalents.

What is claimed is:

1. An electroluminescent display device, comprising:
    a substrate having an emission area and a transparent portion, the emission area including a sub-pixel, and the transparent portion being adjacent to the sub-pixel;
    a first electrode in the emission area and over the substrate;
    a transparent connection pattern in the transparent portion and over the substrate, the transparent connection pattern being spaced apart from the first electrode;
    a first bank covering an edge of the first electrode and exposing the transparent connection pattern in the transparent portion; and
    a second bank on the first bank and covering the transparent connection pattern in the transparent portion,
    wherein the second bank includes a transparent conductive material.

2. The electroluminescent display device according to claim 1, wherein the transparent conductive material includes a conductive polymer, and the conductive polymer is PEDOT:PSS.

3. The electroluminescent display device according to claim 2, wherein the second bank further includes a hydrophobic material, and the hydrophobic material is fluorine.

4. The electroluminescent display device according to claim 1, wherein the transparent conductive material is an organic material having a conductive property and a hydrophobic property.

5. The electroluminescent display device according to claim 4, wherein the organic material is polythiophene.

6. The electroluminescent display device according to claim 1, further comprising:
    an auxiliary electrode on the substrate;
    an auxiliary pattern over the auxiliary electrode; and
    an overcoat layer over the auxiliary pattern and including an auxiliary contact hole corresponding to the transparent portion,
    wherein the transparent connection pattern contacts the auxiliary pattern to be electrically connected to the auxiliary electrode.

7. The electroluminescent display device according to claim 6, wherein a part of the auxiliary pattern protrudes into the auxiliary contact hole, and the transparent connection pattern covers the part of the auxiliary pattern.

8. The electroluminescent display device according to claim 7, wherein the transparent connection pattern has a double-layered structure of a first layer and a second layer on the first layer.

9. The electroluminescent display device according to claim 6, wherein a side surface of the auxiliary pattern is exposed in the auxiliary contact hole, and the side surface of the auxiliary pattern coincides with a side surface of the overcoat layer.

10. The electroluminescent display device according to claim 9, wherein the transparent connection pattern has a single-layered structure.

11. The electroluminescent display device according to claim 1, further comprising:
a light emitting layer on the first electrode; and
a second electrode on the light emitting layer and the second bank.

12. The electroluminescent display device according to claim 11, wherein the light emitting layer is connected to a light emitting layer in another emission area being adjacent to the emission area including the sub-pixel.

13. The electroluminescent display device according to claim 12, wherein the second bank is connected to a second bank in another transparent portion being adjacent to the transparent portion being adjacent to the sub-pixel.

14. The electroluminescent display device according to claim 13, wherein the sub-pixel includes a blue sub-pixel, and the second bank is adjacent the blue sub-pixel.

15. The electroluminescent display device according to claim 14, wherein the second bank includes an extension part extending into a space between the blue sub-pixel and adjacent another blue sub-pixel.

16. The electroluminescent display device according to claim 11, wherein the light emitting layer includes a hole auxiliary layer, an emitting material layer and an electron auxiliary layer, and
wherein at least one side surface of each of the hole auxiliary layer and the emitting material layer is surrounded by the second bank, and a portion of the electron auxiliary layer is positioned between the second bank and the second electrode.

17. The electroluminescent display device according to claim 1, further comprising:
a thin film transistor between the substrate and the first electrode,
wherein the first electrode is connected to the thin film transistor.

18. The electroluminescent display device according to claim 1, wherein the first electrode includes a first layer, a second layer and a third layer sequentially stacked, and
wherein each of the first layer and the third layer includes a transparent conductive material, and the second layer includes a metallic material.

19. The electroluminescent display device according to claim 18, wherein the transparent connection pattern has a double-layered structure of a first layer and a second layer on the first layer, and
wherein the first and second layers of the transparent connection pattern respectively include a same material as the first and third layers of the first electrode.

20. The electroluminescent display device according to claim 18, wherein the transparent connection pattern has a single-layered structure, and
wherein the transparent connection pattern includes a same material as one of the first layer and the third layer of the first electrode.

* * * * *